(12) United States Patent
Chen et al.

(10) Patent No.: US 12,155,201 B2
(45) Date of Patent: Nov. 26, 2024

(54) SOFT TURN-OFF ACTIVE CLAMP PROTECTION CIRCUIT AND POWER SYSTEM

(71) Applicant: SUNWODA MOBILITY ENERGY TECHNOLOGY CO., LTD., Shenzhen (CN)

(72) Inventors: Binbin Chen, Shenzhen (CN); Xiaodong Chen, Shenzhen (CN)

(73) Assignee: SUNWODA MOBILITY ENERGY TECHNOLOGY CO., LTD., Shenzhen (CN)

( * ) Notice: Subject to any disclaimer, the term of this patent is extended or adjusted under 35 U.S.C. 154(b) by 151 days.

(21) Appl. No.: 18/043,744

(22) PCT Filed: Jul. 1, 2021

(86) PCT No.: PCT/CN2021/104011
§ 371 (c)(1),
(2) Date: Mar. 2, 2023

(87) PCT Pub. No.: WO2022/048293
PCT Pub. Date: Mar. 10, 2022

(65) Prior Publication Data
US 2023/0283067 A1 Sep. 7, 2023

(30) Foreign Application Priority Data

Sep. 4, 2020 (CN) .......................... 202010923912.1
Sep. 4, 2020 (CN) .......................... 202021938887.6

(51) Int. Cl.
*H02H 9/00* (2006.01)
*H02H 11/00* (2006.01)
*H03K 17/732* (2006.01)

(52) U.S. Cl.
CPC .......... *H02H 9/001* (2013.01); *H02H 11/003* (2013.01); *H03K 17/732* (2013.01)

(58) Field of Classification Search
CPC ............................. H02H 9/001; H02J 7/00308
See application file for complete search history.

(56) References Cited

U.S. PATENT DOCUMENTS

| | | | | |
|---|---|---|---|---|
| 2010/0134941 A1* | 6/2010 | Nakahara | ........... | H03K 17/0822 |
| | | | | 361/91.1 |
| 2010/0284116 A1* | 11/2010 | Yoshizawa | ............. | H02H 9/001 |
| | | | | 361/91.3 |
| 2019/0149144 A1* | 5/2019 | Zhu | .................... | H03K 17/0822 |
| | | | | 361/86 |

FOREIGN PATENT DOCUMENTS

| | | |
|---|---|---|
| CN | 200976577 Y | 11/2007 |
| CN | 206077778 U | 4/2017 |
| CN | 210724728 U | 6/2020 |

(Continued)

OTHER PUBLICATIONS

International Searching Authority. International Search Report and Written Opinion for PCT Application No. PCT/CN2021/104011 and English translation, mailed Sep. 8, 2021, pp. 1-11.

*Primary Examiner* — Jared Fureman
*Assistant Examiner* — Christopher J Clark
(74) *Attorney, Agent, or Firm* — Vivacqua Crane, PLLC

(57) ABSTRACT

A soft turn-off active clamp protection circuit and a power system are disclosed. The circuit includes a gate connection terminal, a drain connection terminal, a source connection terminal, a discharge capacitor, an overvoltage signal acquisition module, a negative feedback module, a discharge current control module and a turn-off control module.

9 Claims, 2 Drawing Sheets

(56) References Cited

FOREIGN PATENT DOCUMENTS

| CN | 112019010 A | 12/2020 |
|---|---|---|
| CN | 212413046 U | 1/2021 |
| EP | 2978129 B1 | 8/2019 |

* cited by examiner

SOFT TURN-OFF ACTIVE CLAMP PROTECTION CIRCUIT AND POWER SYSTEM

CROSS-REFERENCE TO RELATED APPLICATION

This application is a national stage filing under 35 U.S.C. § 371 of international application number PCT/CN2021/104011, filed Jul. 1, 2021, which claims priority to Chinese patent application No. 2020109239121 and No. 2020219388876 filed Sep. 4, 2020. The contents of these applications are incorporated herein by reference in their entirety.

TECHNICAL FIELD

The present disclosure relates to the field of circuits, and particularly to a soft turn-off active clamp protection circuit and a power system.

BACKGROUND

With reference to FIG. 1, in an electric vehicle system, when a battery management system (BMS) detects an overcurrent or other safety-related failures in a charging and discharging process, it is necessary to turn off a circuit breaker switch in time for protection. Typically the MOSFET is used as the circuit breaker switch. However, due to lead inductance of wire harness or inductive load connected to an output of the BMS during on-load turn-off, a very large voltage spike may be produced at drain and source terminals of the MOSFET at a turn-off instant, resulting in avalanche breakdown of the MOSFET, and the MOSFET is easy to be damaged when turn-off energy is excessively large.

In order to avoid the above failures, a usual design is to absorb a voltage spike and energy at a turn-off instant by a clamp TVS diode, but a high-power TVS is difficult in model selection. If the TVS is used as a clamp for absorption, the high-power TVS with a high cost needs to be used, and 4 to 5 TVSs need to be used to bear such energy. Meanwhile, sufficient heat dissipation copper foils should be allocated to the TVS during layout, resulting in a high cost and a large occupied area. Moreover, the TVS has a high short-circuit failure rate, an absorption power greatly affected by temperature, and reduced working reliability at a high temperature. When the TVS fails, it will cause clamping failure and MOSFET damage, and even more seriously, it will cause the circuit breaker of the BMS to be disconnected and cause thermal runaway events.

SUMMARY

The present disclosure is mainly intended to provide a soft turn-off active clamp protection circuit and a power system, aiming at solving existing problems of a high failure rate and a large occupied area caused by absorbing a voltage spike and energy at a turn-off instant by a clamp TVS diode.

The present disclosure provides a soft turn-off active clamp protection circuit, connected with a MOSFET and configured for controlling turn-off of the MOSFET, wherein the circuit comprises a gate connection terminal, a drain connection terminal, a source connection terminal, a discharge capacitor, an overvoltage signal acquisition module, a negative feedback module, a discharge current control module and a turn-off control module;

the gate connection terminal is connected with a gate of the MOSFET;
the source connection terminal is connected with a source of the MOSFET;
the drain connection terminal is connected with a drain of the MOSFET;
the gate connection terminal, the drain connection terminal and the source connection terminal are connected with each other;
one end of the discharge capacitor is connected with the gate connection terminal, and the other end of the discharge capacitor is connected with the source connection terminal;
the overvoltage signal acquisition module is connected between the source connection terminal and the drain connection terminal;
the discharge current control module and the turn-off control module are connected in series between the gate connection terminal and the source connection terminal;
the negative feedback module is connected to the overvoltage signal acquisition module and the discharge current control module;
the overvoltage signal acquisition module is configured for being turned on when an overvoltage signal is acquired;
the negative feedback module gives negative feedback to the discharge current control module when the overvoltage signal acquisition module is turned on, and the discharge current control module controls a discharge current of the discharge capacitor according to the negative feedback, thereby controlling an output current of the gate connection terminal; and
the turn-off control module is turned off or turned on according to the intended output of the gate connection terminal.

Further, the overvoltage signal acquisition module comprises a first diode, a first resistor and a second resistor which are sequentially connected in series, a cathode of the first diode is connected with the drain connection terminal, the negative feedback module comprises a control terminal, the control terminal of the negative feedback module is connected between the first resistor and the second resistor, and the other end of the second resistor is connected with the source connection terminal.

Further, the first diode is a Zener diode.

Further, the overvoltage signal acquisition module further comprises a first capacitor, and the first capacitor is connected with the first diode in parallel.

Further, the negative feedback module comprises a fourth resistor and a first triode; one end of the fourth resistor is connected with the drain connection terminal, and the other end of the fourth resistor is connected with a collector of the first triode; an emitter of the first triode is connected with the source connection terminal, a base of the first triode is connected with the overvoltage signal acquisition module, and the base of the first triode is a control terminal of the negative feedback module; and the discharge current control module comprises a control terminal, and the control terminal of the discharge current control module is connected to the other end of the fourth resistor.

Further, the discharge current control module comprises a second triode; a base of the second triode is a control terminal of the discharge current control module; and the base of the second triode is connected with the negative feedback module, a collector of the second triode is connected with the turn-off control module, and an emitter of the second triode is connected with the source connection terminal.

Further, the discharge current control module further comprises a fifth resistor, and the second triode is connected with the fifth resistor in series.

Further, the turn-off control module comprises a third triode; a base of the third triode is connected with a MOS driving module through a second diode, the base of the third triode is connected with an anode of the second diode, a collector of the third triode is connected with the gate connection terminal, and an emitter of the third triode is connected with the discharge current control module; and the MOS driving module is connected with the gate connection terminal through a third diode, and the gate connection terminal is connected with a cathode of the third diode.

The present disclosure further provides a power system comprising a charging and discharging circuit and the soft turn-off active clamp protection circuit above; the charging and discharging circuit comprises a power supply and the MOSFET, the power supply, the MOSFET and a load constitute a loop, and the soft turn-off active clamp protection circuit is connected with the MOSFET; and a control system of the power supply comprises the MOS driving module, the MOS driving module is connected with the turn-off control module and the gate connection terminal, and the MOS driving module controls turn-off or turn-on of the turn-off control module according to the output current of the gate connection terminal.

The soft turn-off active clamp protection circuit and the power system of the present disclosure have the beneficial effects as follows. The overvoltage signal acquisition module, the negative feedback module, the discharge current control module and the turn-off control module constitute a closed-loop negative feedback regulation system to achieve an effect of limiting a drain-source voltage of the MOSFET to a set voltage value, thereby regulating and controlling a turn-off speed of the MOSFET to achieve voltage clamping and self-absorption of transient energy. Instead of using the TVS diode to absorb a voltage spike and energy at a turn-off instant, no high temperature is produced, a problem of a high failure rate caused by high temperature is solved, and no heat-dissipating structure to deal with high temperature is required. Therefore, existing problems of a high failure rate and a large occupied area caused by absorbing the voltage spike and the energy at the turn-off instant by the clamp TVS diode are solved.

Figure 1:
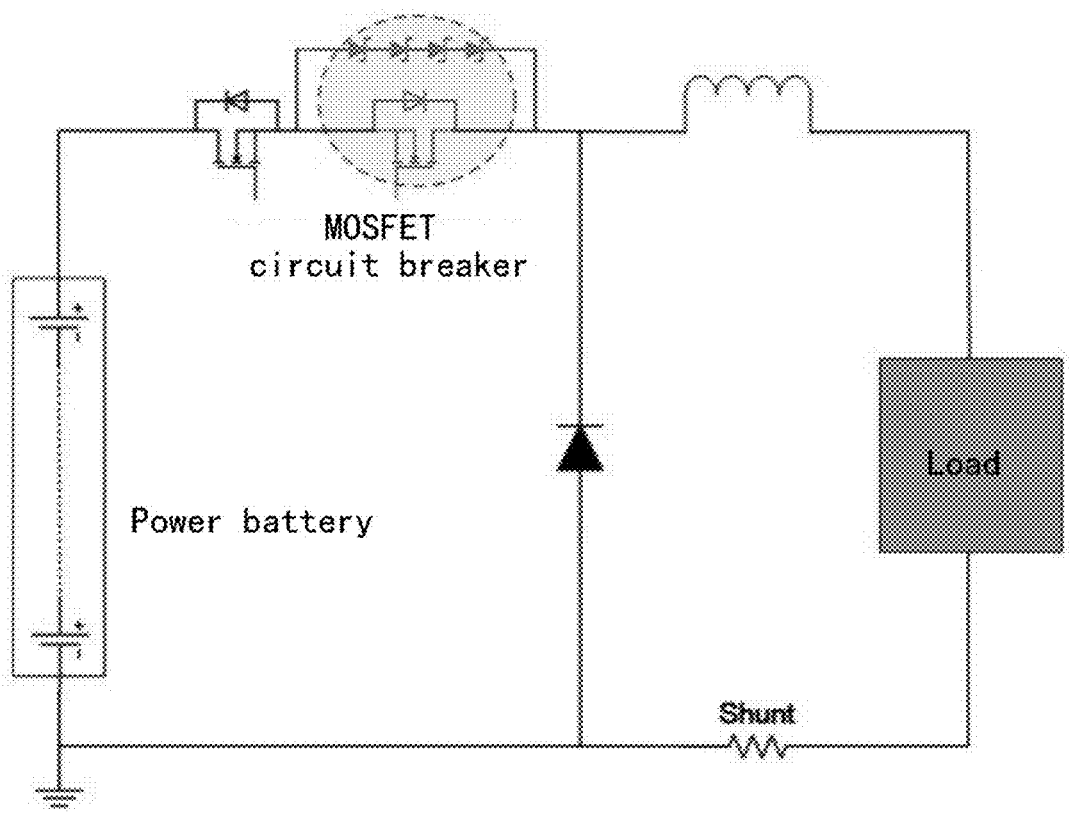
FIG. 1 is a schematic structural diagram of an existing power system.
Figure 2:
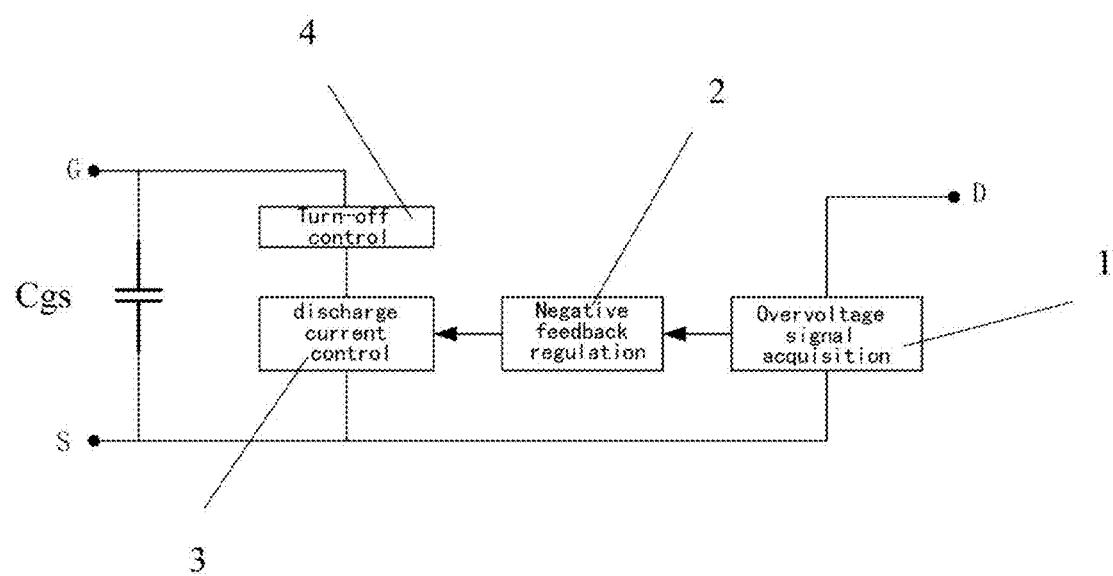
FIG. 2 is a schematic structural diagram of an embodiment of a soft turn-off active clamp protection circuit of the present disclosure.

The realization of the objectives, the functional features and the advantages of the present disclosure are further described with reference to the drawings and the embodiments.

DETAILED DESCRIPTION

The technical solutions in the embodiments of the present disclosure are clearly and completely described hereinafter with reference to the drawings in the embodiments of the present disclosure. Obviously, the described embodiments are merely some but not all of the embodiments of the present disclosure. Based on the embodiments in the present disclosure, all other embodiments obtained by those of ordinary skills in the art without going through any creative work should fall within the scope of protection of the present disclosure.

It should be noted that all directional indications (such as upper, lower, left, right, front, rear, etc.) in the embodiments of the present disclosure are merely used to explain the relative positional relationship, movement condition, etc. among various components under a certain specific posture (as shown in the drawings), and if the specific posture is changed, the directional indications are also changed accordingly. The connection may be direct connection or indirect connection.

In addition, the descriptions related to "first", "second", etc. in the present disclosure are used for descriptive purposes only and cannot be understood as indicating or implying relative importance, or implicitly indicating the number of technical features indicated thereby. Thus, the feature defined by "first" and "second" may explicitly or implicitly comprise at least one feature. In addition, the technical solutions in the embodiments can be combined with each other, which should be on the basis that the combination can be realized by those of ordinary skills in the art, when the combination of the technical solutions is contradictory or cannot be realized, it should be considered that the combination of the technical solutions does not exist and does not fall within the scope of protection of the present disclosure.

With reference to FIG. 1 to FIG. 4, the present disclosure provides a soft turn-off active clamp protection circuit, connected with a MOSFET and configured for controlling turn-off of the MOSFET, wherein the circuit comprises a gate connection terminal G, a drain connection terminal D, a source connection terminal S, a discharge capacitor Cgs, an overvoltage signal acquisition module 1, a negative feedback module 2, a discharge current control module 3 and a turn-off control module 4. The gate connection terminal G is connected with a gate of the MOSFET; the source connection terminal S is connected with a source of the MOSFET; and the drain connection terminal D is connected with a drain of the MOSFET. The gate connection terminal G, the drain connection terminal D and the source connection terminal S are connected with each other. One end of the discharge capacitor Cgs is connected with the gate connection terminal G, and the other end of the discharge capacitor is connected with the source connection terminal S. The overvoltage signal acquisition module 1 is connected between the source connection terminal S and the drain connection terminal D; the discharge current control module 3 and the turn-off control module 4 are connected in series between the gate connection terminal G and the source connection terminal S; and the negative feedback module 2 is connected to the overvoltage signal acquisition module 1 and the discharge current control module 3. The overvoltage signal acquisition module 1 is configured for being turned on when an overvoltage signal is acquired; the negative feedback module 2 gives negative feedback to the discharge current control module 3 when the overvoltage signal acquisition module 1 is turned on, and the discharge current control module 3 controls a discharge current of the discharge capacitor Cgs according to the negative feedback, thereby controlling an output current of the gate connection terminal G. The turn-off control module 4 is turned off or turned on according to the intended output of the gate connection terminal G.

Specifically, at the turn-off instant, a driving signal of the base connection terminal becomes low, the discharge capacitor Cgs between the gate connection terminal G and the source connection terminal S starts to discharge, the MOSFET starts to be turned off, a charging current is reduced, and a voltage of the drain of the MOSFET is increased. In the case of overvoltage, the overvoltage signal acquisition module 1 is turned on, and the negative feedback regulation module is driven to be turned on to start negative feedback regulation. The larger the current flowing through the negative feedback regulation module, the smaller the current flowing through the discharge current control module 3 is controlled to be, realizing control of the discharge current of the gate connection terminal G. When the discharge current of the gate connection terminal G is controlled, an effect of limiting a drain-source voltage of the MOSFET to a set voltage value is achieved, and a turn-off speed of the MOSFET is also controlled by the feedback regulation at the same time, so as to prolong a turn-off time, realize soft turn-off of the MOSFET, and achieve voltage clamping and self-absorption of transient energy. Instead of using the TVS diode to absorb a voltage spike and energy at the turn-off instant, no high temperature is produced, a problem of a high failure rate caused by high temperature is solved, and no heat-dissipating structure to deal with high temperature is required. Therefore, existing problems of a high failure rate and a large occupied area caused by absorbing the voltage spike and the energy at the turn-off instant by the clamp TVS diode are solved.

Moreover, if a voltage of the drain connection terminal D is in a normal range, the overvoltage signal acquisition module 1 is not turned on, the negative feedback regulation module is turned off, and the turn-off control module 4 and the discharge current control module 3 are normally turned on, such that a current flowing through the turn-off control module 4 and the discharge current control module 3 is not limited, and a normal discharge current reaches the gate connection terminal G of the gate of the MOSFET, thereby not affecting a normal turn-off speed of the MOSFET.

The beneficial effects are described as follows. The overvoltage signal acquisition module 1, the negative feedback module 2, the discharge current control module 3 and the turn-off control module 4 constitute a closed-loop negative feedback regulation system to achieve the effect of limiting the drain-source voltage of the MOSFET to the set voltage value, thereby regulating and controlling the turn-off speed of the MOSFET to achieve voltage clamping and self-absorption of transient energy. Instead of using the TVS diode to absorb the voltage spike and the energy at the turn-off instant, no high temperature is produced, the problem of the high failure rate caused by high temperature is solved, and no heat-dissipating structure to deal with high temperature is required. Therefore, existing problems of a high failure rate and a large occupied area caused by absorbing the voltage spike and the energy at the turn-off instant by the clamp TVS diode are solved.

Further, in some embodiments, the overvoltage signal acquisition module 1 comprises a first diode ZD, a first resistor R1 and a second resistor R2 which are sequentially connected in series, a cathode of the first diode ZD is connected with the drain connection terminal D, the negative feedback module 2 comprises a control terminal, the control terminal of the negative feedback module 2 is connected between the first resistor R1 and the second resistor R2, and the other end of the second resistor R2 is connected with the source connection terminal S.

Specifically, in the case of overvoltage, the first diode ZD is reversely broken down, and the overvoltage signal acquisition module 1 is turned on, wherein the first resistor R1 and the second resistor R2 have current limiting and voltage dividing functions.

Further, the first diode ZD is a Zener diode. For being beneficial for reverse breakdown, the first diode ZD is selected according to a target clamp voltage value, which is generally Zener of about 10 V, such that the D-S voltage of the MOSFET will be clamped at about 11 V during turn-off.

Further, in some embodiments, the overvoltage signal acquisition module 1 further comprises a first capacitor C1, and the first capacitor C1 is connected with the first diode ZD in parallel. A filtering function is achieved by the first capacitor C1. The first capacitor 1 is a speed-up capacitor, which can realize fast response of a feedback loop, and the capacitor needs to be regulated according to actual conditions, wherein a value thereof is generally less than 1 nF.

Further, the discharge capacitor Cgs is a GS parasitic capacitor.

Further, in some embodiments, the negative feedback module 2 comprises a fourth resistor R4 and a first triode Q1. One end of the fourth resistor R4 is connected with the drain connection terminal D, and the other end of the fourth resistor is connected with a collector of the first triode Q1. An emitter of the first triode Q1 is connected with the source connection terminal S, a base of the first triode Q1 is connected with the overvoltage signal acquisition module 1, and the base of the first triode Q1 is a control terminal of the negative feedback module 2. The discharge current control module 3 comprises a control terminal, and the control terminal of the discharge current control module 3 is connected to the other end of the fourth resistor R4.

Specifically, the larger the current between the drain connection terminal D and the source connection terminal S, the smaller the voltage of the collector of the first triode Q1 due to voltage division of a fourth resistor R4, and the smaller the voltage output to the discharge current control module 3, thereby realizing negative feedback.

In some embodiments, the negative feedback module 2 further comprises a third resistor R3, and two ends of the third resistor R3 are respectively connected with the emitter of the first triode Q1 and the source connection terminal, thereby having current limiting and voltage division functions.

Further, in some embodiments, the discharge current control module 3 comprises a second triode. A base of the second triode is a control terminal of the discharge current control module 3. The base of the second triode is connected with the negative feedback module 2, a collector of the second triode is connected with the turn-off control module 4, and an emitter of the second triode is connected with the source connection terminal S.

Specifically, the second triode receives a control signal of the negative feedback module 2, such that a current flowing through the second triode is regulated according to the control signal.

Further, in some embodiments, the discharge current control module 3 further comprises a fifth resistor R5, and the second triode is connected with the fifth resistor R5 in series. The fifth resistor R5 has a current limiting function.

Further, in some embodiments, the turn-off control module 4 comprises a third triode Q3. A base of the third triode Q3 is connected with a MOS driving module through a second diode, the base of the third triode Q3 is connected with an anode of the second diode, a collector of the third triode Q3 is connected with the gate connection terminal G, and an emitter of the third triode Q3 is connected with the discharge current control module 3. The MOS driving module is connected with the gate connection terminal G through a third diode, and the gate connection terminal G is connected with a cathode of the third diode.

Specifically, the BMS sends a turn-off signal to the gate when turning off the MOSFET, which means that, a level at the gate connection terminal G becomes low, the discharge capacitor Cgs discharges, and a current signal between the collector of the third triode Q3 and the base of the third triode Q3 is fed back to the MOS driving module. When the current is greater than a set value, the MOS driving module breaks down the second diode to control the third triode Q3 to be turned on. When the discharge current at the gate connection terminal G is lowered to a certain extent, a current between the collector of the third triode Q3 and the base of the third triode Q3 is less than the set value, the MOS driving module does not break down the second diode, the third triode Q3 is turned off, and the MOSFET is turned off, thereby regulating and controlling the turn-off speed of the MOSFET to achieve voltage clamping and self-absorption of transient energy. The MOS driving module may be a single chip microcomputer in the battery management system (BMS), or an independent single chip microcomputer connected with the battery management system (BMS).

Figure 3:
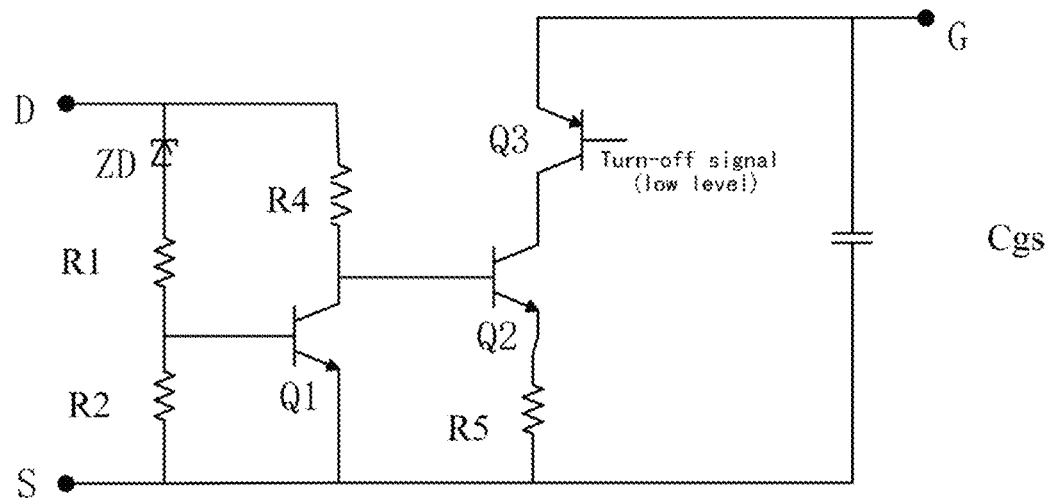
FIG. 3 is a schematic structural diagram of another embodiment of the soft turn-off active clamp protection circuit of the present disclosure.
Figure 4:
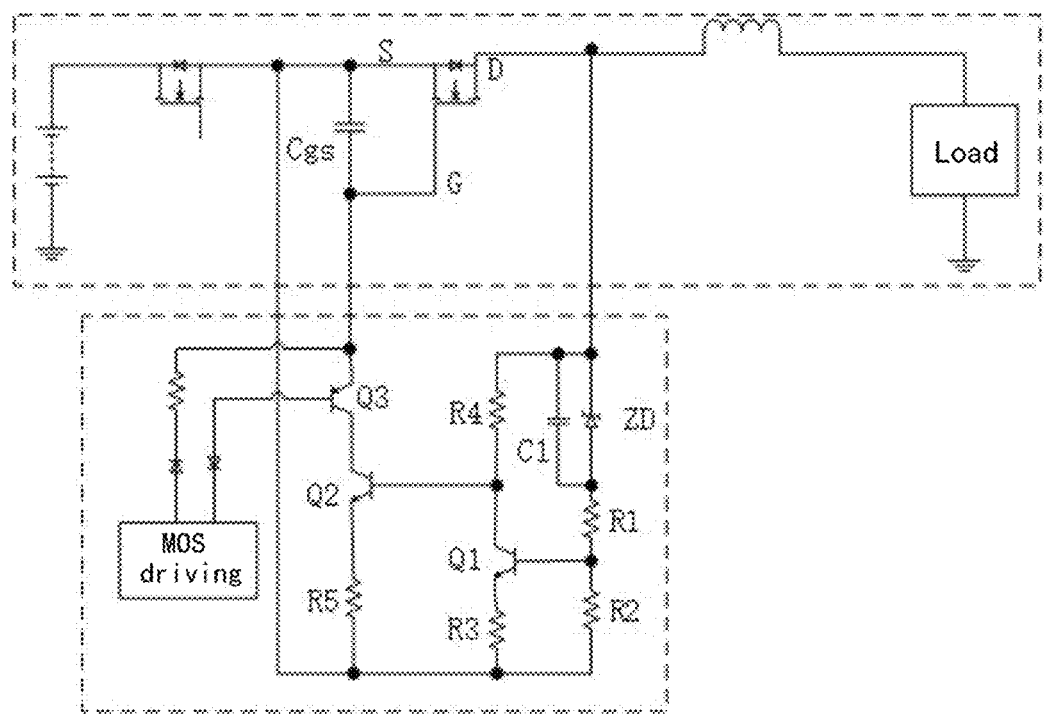
FIG. 4 is a schematic structural diagram of an embodiment of a power system of the present disclosure.

With reference to FIG. 3 to FIG. 4, in the embodiment, the overvoltage signal acquisition module 1 comprises the first diode ZD, the first resistor R1 and the second resistor R2 which are sequentially connected in series. The overvoltage signal acquisition module 1 further comprises the first capacitor C1, and the first capacitor is connected with the first diode ZD in parallel. The negative feedback module 2 comprises the fourth resistor R4 and the first triode Q1. The discharge current control module 3 comprises the second triode and the fifth resistor R5. The turn-off control module 4 comprises the third triode Q3. The cathode of the first diode ZD is connected with the drain connection terminal D, the base of the first triode Q1 is connected between the first resistor R1 and the second resistor R2, and the other end of the second resistor R2 is connected with the source connection terminal S. The first capacitor C1 is connected with the first diode ZD in parallel. One end of the fourth resistor R4 is connected with the drain connection terminal D, and the other end of the fourth resistor is connected with the collector of the first triode Q1. The emitter of the first triode Q1 is connected with the source connection terminal S through the third resistor R3, the base of the first triode Q1 is connected between the first resistor R1 and the second resistor R2, and the base of the first triode Q1 is the control terminal of the negative feedback module 2. The base of the second triode is connected to the other end of the fourth resistor R4, the collector of the second triode is connected with the emitter of the third triode Q3, and the emitter of the second triode is connected with the source connection terminal S through the fifth resistor R5. The base of the third triode Q3 is connected with the MOS driving module through the second diode, the base of the third triode Q3 is connected with the anode of the second diode, and the collector of the third triode Q3 is connected with the gate connection terminal G. The MOS driving module is connected with the gate connection terminal G through the third diode, and the gate connection terminal G is connected with the cathode of the third diode.

Specifically, the BMS sends a turn-off signal to the gate when turning off the MOSFET, which means that, the level at the gate connection terminal G becomes low, the discharge capacitor Cgs discharges, and the current signal between the collector of the third triode Q3 and the base of the third triode Q3 is fed back to the MOS driving module. When the current is greater than the set value, the MOS driving module breaks down the second diode to control the third triode Q3 to be turned on. When the discharge current at the gate connection terminal G is lowered a certain extent, the current between the collector of the third triode Q3 and the base of the third triode Q3 is less than the set value, the MOS driving module does not break down the second diode, the third triode Q3 is turned off, and the MOSFET is turned off, thereby regulating and controlling the turn-off speed of the MOSFET. During turn-off of the MOSFET, lead inductance of wire harness or inductive load may produce a very large voltage spike, and the voltage between the source and the drain of the MOSFET may be changed, which means that the voltage between the source connection terminal S and the drain connection terminal D is changed. In the case of overvoltage, the first diode ZD is reversely broken down, and the first triode Q1 is turned on. Under an action of negative feedback, the second triode Q2 may be controlled, such that the current of the collector of the third triode Q3 is controlled, which is namely the discharge current of the capacitor at the gate of the MOSFET. When the discharge current of the gate of the MOSFET is controlled, the turn-off speed of the MOSFET is also controlled by feedback regulation. The higher the voltage of the drain of the MOSFET is, the greater the current of the collector of the first triode Q1 will be, and the lower the voltage of the collector controlled to be output by negative feedback will be, and the lower the voltage of the base of the second triode Q2 will be, the lower the current of the collector of the third triode Q3 will be, that is, the smaller the discharge current will be. If the voltage of the drain (the drain connection terminal D) of the MOSFET is in the normal range, the first diode ZD is not broken down, the first triode Q1 is turned off, the second triode Q2 and the third triode Q3 are both saturated, and the discharge current of the gate of the MOSFET is the normal discharge current, which will not affect the normal turn-off speed.

The present disclosure further provides a power system comprising a charging and discharging circuit and the soft turn-off active clamp protection circuit above. The charging and discharging circuit comprises a power supply and the MOSFET, the power supply, the MOSFET and a load constitute a loop, and the soft turn-off active clamp protection circuit is connected with the MOSFET. A control system of the power supply comprises the MOS driving module, the MOS driving module is connected with the turn-off control module 4 and the gate connection terminal G, and the MOS driving module controls turn-off or turn-on of the turn-off control module 4 according to the output current of the gate connection terminal G.

The soft turn-off active clamp protection circuit and the power system of the present disclosure have the beneficial effects as follows. The overvoltage signal acquisition module 1, the negative feedback module 2, the discharge current control module 3 and the turn-off control module 4 constitute the closed-loop negative feedback regulation system to achieve the effect of limiting the drain-source voltage of the MOSFET to the set voltage value, thereby regulating and controlling the turn-off speed of the MOSFET to achieve voltage clamping and self-absorption of transient energy. Instead of using the TVS diode to absorb the voltage spike and the energy at the turn-off instant, no high temperature is produced, a problem of a high failure rate caused by high temperature is solved, and no heat-dissipating structure to deal with high temperature is required. Therefore, existing problems of a high failure rate and a large occupied area caused by absorbing the voltage spike and the energy at the turn-off instant by the clamp TVS diode are solved.

The above are only some embodiments of the present disclosure and are not intended to limit the present disclosure. For those of ordinary skills in the art, the present disclosure may have various modifications and changes. Any modifications, equivalent substitutions, improvements, etc. made within the gist and principle of the present disclosure should all fall within the scope of the claims of the present disclosure.

What is claimed is:

1. A soft turn-off active clamp protection circuit, connected with a MOSFET and configured for controlling turn-off of the MOSFET, wherein the circuit comprises a gate connection terminal, a drain connection terminal, a source connection terminal, a discharge capacitor, an overvoltage signal acquisition module, a negative feedback module, a discharge current control module and a turn-off control module;
    the gate connection terminal is connected with a gate of the MOSFET;
    the source connection terminal is connected with a source of the MOSFET;
    the drain connection terminal is connected with a drain of the MOSFET;
    the gate connection terminal, the drain connection terminal and the source connection terminal are connected with each other;
    one end of the discharge capacitor is connected with the gate connection terminal, and the other end of the discharge capacitor is connected with the drain connection terminal;
    the overvoltage signal acquisition module is connected between the source connection terminal and the drain connection terminal;
    the discharge current control module and the turn-off control module are connected in series between the gate connection terminal and the source connection terminal;
    the negative feedback module is connected to the overvoltage signal acquisition module and the discharge current control module;
    the overvoltage signal acquisition module is configured for being turned on when an overvoltage signal is acquired;
    the negative feedback module gives negative feedback to the discharge current control module when the overvoltage signal acquisition module is turned on, and the discharge current control module controls a discharge current of the discharge capacitor according to the negative feedback, thereby controlling an output current of the gate connection terminal; and
    the turn-off control module is turned off or turned on according to the intended output of the gate connection terminal.

2. The soft turn-off active clamp protection circuit according to claim 1, wherein the overvoltage signal acquisition module comprises a first diode, a first resistor and a second resistor which are sequentially connected in series, a cathode of the first diode is connected with the drain connection terminal, the negative feedback module comprises a control terminal, the control terminal of the negative feedback module is connected between the first resistor and the second resistor, and an other end of the second resistor is connected with the source connection terminal.

3. The soft turn-off active clamp protection circuit according to claim 2, wherein the first diode is a Zener diode.

4. The soft turn-off active clamp protection circuit according to claim 2, wherein the overvoltage signal acquisition module further comprises a first capacitor, and the first capacitor is connected with the first diode in parallel.

5. The soft turn-off active clamp protection circuit according to claim 1, wherein the negative feedback module comprises a fourth resistor and a first triode; one end of the fourth resistor is connected with the drain connection terminal, and the other end of the fourth resistor is connected with a collector of the first triode; an emitter of the first triode is connected with the source connection terminal, a base of the first triode is connected with the overvoltage signal acquisition module, and the base of the first triode is a control terminal of the negative feedback module; and the discharge current control module comprises a control terminal, and the control terminal of the discharge current control module is connected to the other end of the fourth resistor.

6. The soft turn-off active clamp protection circuit according to claim 1, wherein the discharge current control module comprises a second triode; a base of the second triode is a control terminal of the discharge current control module; and the base of the second triode is connected with the negative feedback module, a collector of the second triode is connected with the turn-off control module, and an emitter of the second triode is connected with the source connection terminal.

7. The soft turn-off active clamp protection circuit according to claim 6, wherein the discharge current control module further comprises a fifth resistor, and the second triode is connected with the fifth resistor in series.

8. The soft turn-off active clamp protection circuit according to claim 1, wherein the turn-off control module comprises a third triode; a base of the third triode is connected with a MOS driving module through a second diode, the base of the third triode is connected with an anode of the second diode, a collector of the third triode is connected with the gate connection terminal, and an emitter of the third triode is connected with the discharge current control module; and the MOS driving module is connected with the gate connection terminal through a third diode, and the gate connection terminal is connected with a cathode of the third diode.

9. A power system comprising a charging and discharging circuit and the soft turn-off active clamp protection circuit according to claim 1; wherein
    the charging and discharging circuit comprises a power supply and the MOSFET, the power supply, the MOSFET and a load constitute a loop, and the soft turn-off active clamp protection circuit is connected with the MOSFET; and
    a control system of the power supply comprises a MOS driving module, the MOS driving module is connected with the turn-off control module and the gate connection terminal, and the MOS driving module controls turn-off or turn-on of the turn-off control module according to the output current of the gate connection terminal.

* * * * *